United States Patent [19]

Zenke et al.

[11] Patent Number: 5,525,540
[45] Date of Patent: Jun. 11, 1996

[54] METHOD FOR MANUFACTURING SILICON LAYER HAVING IMPURITY DIFFUSION PREVENTING LAYER

[75] Inventors: Masanobu Zenke; Fumiki Aisou, both of Tokyo, Japan

[73] Assignee: NEC Corporation, Tokyo, Japan

[21] Appl. No.: 355,213

[22] Filed: Dec. 9, 1994

[30] Foreign Application Priority Data

Dec. 13, 1993 [JP] Japan .................................. 5-342449

[51] Int. Cl.$^6$ .................................................. H01L 21/22
[52] U.S. Cl. ........................... 437/151; 437/83; 437/101; 437/233; 117/89
[58] Field of Search .............................. 437/81, 83, 84, 437/101, 233, 151; 117/89

[56] References Cited

U.S. PATENT DOCUMENTS

| | | | |
|---|---|---|---|
| 4,685,199 | 8/1987 | Jastrzebski | 437/81 |
| 4,874,464 | 10/1989 | Goodwin et al. | 437/85 |
| 4,990,464 | 2/1991 | Baumgart et al. | 437/83 |
| 5,256,566 | 10/1993 | Bailey | 437/81 |
| 5,266,504 | 11/1993 | Blouse et al. | 437/83 |

FOREIGN PATENT DOCUMENTS

| | | |
|---|---|---|
| 30024 | 2/1986 | Japan . |
| 2-45930 | 2/1990 | Japan . |
| 0151064 | 6/1990 | Japan . |
| 4-162675 | 6/1992 | Japan . |

*Primary Examiner*—R. Bruce Breneman
*Assistant Examiner*—Ramamohan Rao Paladugu
*Attorney, Agent, or Firm*—Whitham, Curtis, Whitham & McGinn

[57] ABSTRACT

In a method for manufacturing a silicon layer, a silicon layer is grown simultaneously with doping impurities into the silicon layer. Then, an impurity diffusion preventing layer is grown by interrupting this silicon layer growing step at least one time.

26 Claims, 5 Drawing Sheets

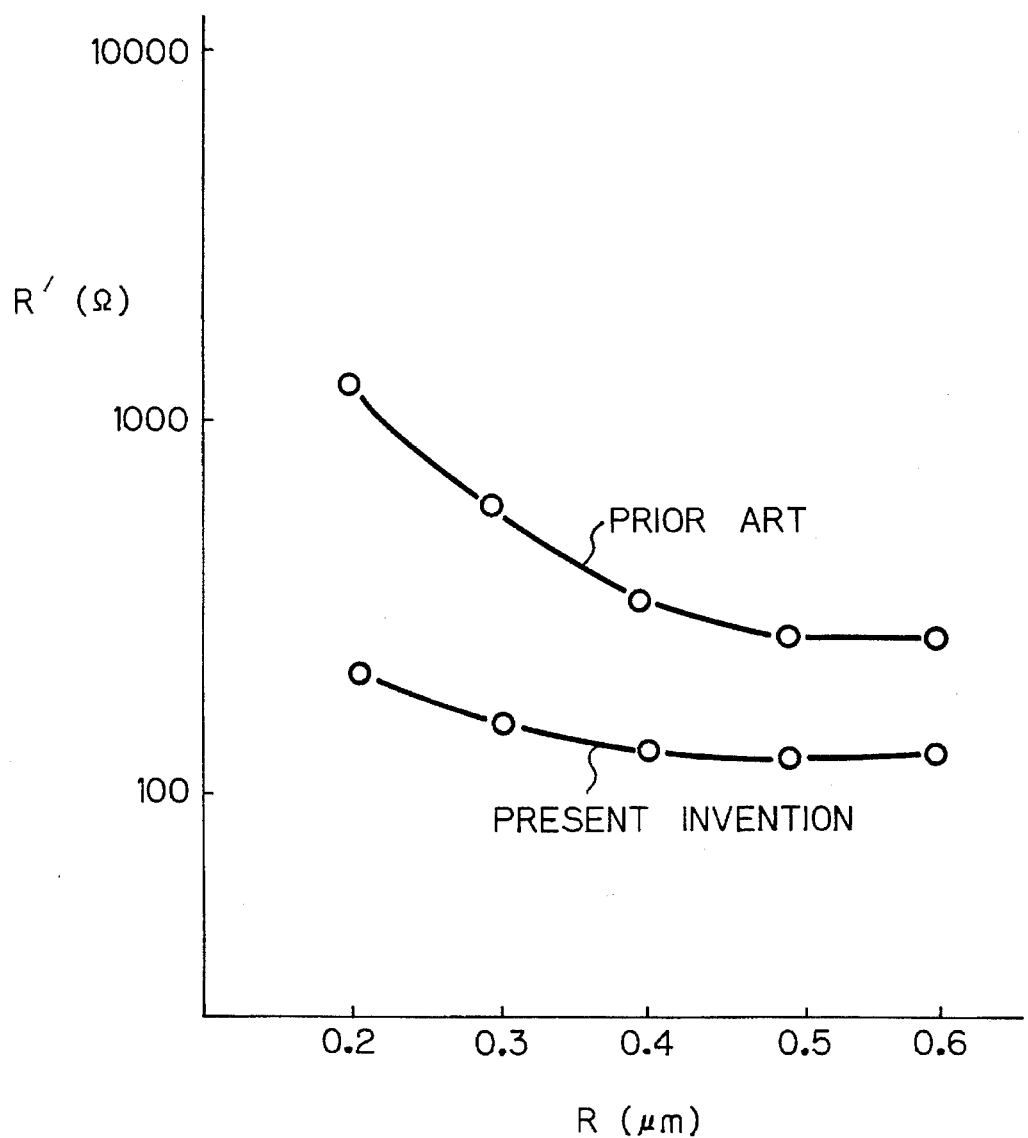

METHOD FOR MANUFACTURING SILICON LAYER HAVING IMPURITY DIFFUSION PREVENTING LAYER

BACKGROUND OF THE INVENTION

1. Field of the Invention

The present invention relates to a method for manufacturing a semiconductor device, and more particularly, to a method for manufacturing a silicon layer having an impurity diffusion preventing layer therein.

2. Description of the Related Art

In a semiconductor device, a polycrystalline silicon layer has been used as an electrode, a contact structure, and the like. This polycrystalline silicon layer is grown by a chemical vapor deposition (CVD) method or a sputtering method. After that, impurities such as phosphorus and arsenic are introduced by a diffusion method or an ion-implantation method into the polycrystalline silicon layer, thereby reducing the resistance thereof.

On the other hand, as semiconductor devices have been reduced in size, when the above-mentioned polycrystalline silicon layer is formed as a gate electrode on a gate insulating layer, the impurities included in the polycrystalline silicon layer are diffused into the gate insulating layer by a heat operation carried out at a post stage, thus changing the property of the gate insulating layer. Similarly, when the above-mentioned polycrystalline silicon layer is formed as a contact structure on a semiconductor substrate, the impurities included in the polycrystalline silicon layer are diffused into an impurity diffusion region within the semiconductor substrate by a heat operation carried out at a post stage, thus enlarging the impurity diffusion region.

In order to prevent impurities from being diffused into the gate insulating layer or the impurity diffusion region, an impurity diffusion preventing layer is formed in the polycrystalline silicon layer (see JP-A-HEI4-162675 and JP-A-HEI2-45930). That is, first, a first polycrystalline silicon layer is grown. Then, a native silicon oxide layer is formed on the first polycrystalline silicon layer, or a silicon oxide layer is grown by supplying Ar gas including oxygen to a CVD apparatus. Then, a second polycrystalline silicon layer is grown on the native silicon oxide layer or the grown silicon oxide layer in the same CVD apparatus, and thereafter, impurities are doped into the second polycrystalline silicon layer. In this case, the concentration of impurities of the first polycrystalline silicon layer is smaller than that of the second polycrystalline silicon layer, thus suppressing the diffusion of impurities into the gate insulating layer or impurity diffusion region.

In the above-mentioned prior art method, however, when an aspect ratio of the gate electrode or the contact structure has become larger, for example, when a contact structure having a radius of 0.4 μm and a height of 1 μm is formed in a 256 Mbit dynamic random access memory (DRAM) device, impurities are hardly doped into the contact structure. Therefore, a step of growing a polycrystalline silicon layer having a thickness of several hundreds of Å to 1000 Å and a step of doping impurities thereinto have to be repeated a plurality of times, thus increasing the manufacturing cost.

SUMMARY OF THE INVENTION

It is, therefore, an object of the present invention to reduce the manufacturing cost in a method for manufacturing a silicon layer having an impurity diffusion preventing layer therein.

According to the present invention, in a method for manufacturing a silicon layer, a silicon layer is grown simultaneously with doping impurities into the silicon layer. Then, an impurity diffusion preventing layer is grown by interrupting this silicon layer growing step at least one time.

Thus, the resistance of a gate electrode or a contact structure formed by the silicon layer can be reduced. Also, the growth of the silicon layer and the growth of the impurity diffusion preventing layer can be carried out by the same CVD apparatus.

BRIEF DESCRIPTION OF THE DRAWINGS

The present invention will be more clearly understood from the description as set forth below, as compared with the prior art, with reference to the accompanying drawings, wherein:

FIG. 7 is a graph showing the resistance characteristics of a contact structure of the present invention.

DESCRIPTION OF THE PREFERRED EMBODIMENT

Before the description of the preferred embodiment, a prior art semiconductor device will be explained with reference to FIG. 1.

Figure 1:
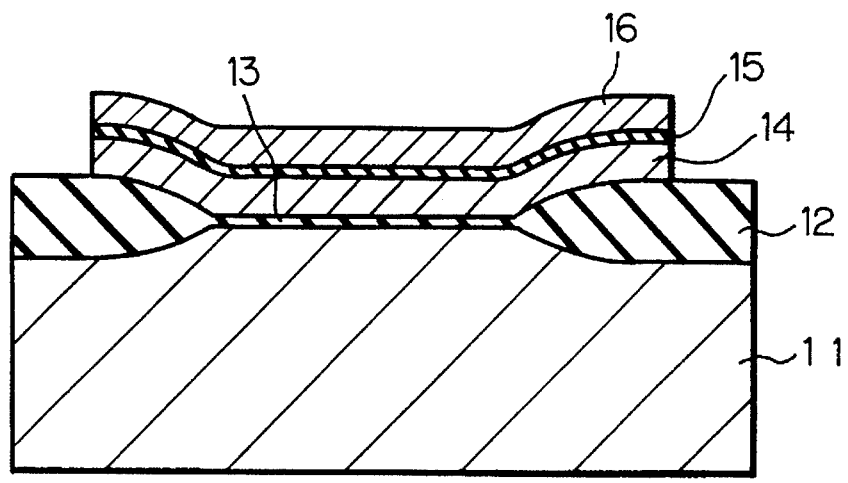
FIG. 1 is a cross-sectional view illustrating a prior art semiconductor device.

In FIG. 1, a field silicon oxide layer 12 is grown by using a local oxidation of silicon (LOCOS) process on a monocrystalline silicon substrate 11, and thereafter, a gate silicon oxide layer 13 is grown by thermally oxidizing the silicon substrate 11. Then, a first polycrystalline silicon layer 14 is grown in a CVD apparatus. Then, this semiconductor device is moved out of the CVD apparatus, and as a result, a native silicon oxide layer is grown as an impurity diffusion preventing layer 15. Otherwise, the impurity diffusion preventing layer 15 is grown by supplying oxygen to the same CVD apparatus. Then, a second polycrystalline silicon layer 16 is grown in the CVD apparatus, and thereafter, impurities such as phosphorus or arsenic are doped thereinto. Thus, the concentration of impurities of the first polycrystalline silicon layer 14 can be reduced as compared with that of the second polycrystalline silicon layer 16. In other words, the diffusion of impurities from the polycrystalline silicon layer 14 and 16 into the gate silicon oxide layer 13 is suppressed due to the presence of the impurity diffusion preventing layer 15. Then, a second polycrystalline silicon layer 16 is grown on the native silicon oxide layer or the CVD-grown silicon oxide layer, and thereafter, impurities are doped into the second polycrystalline silicon layer 16. In this case, the concentration of impurities of the first polycrystalline silicon layer 14 is smaller than that of the second polycrystalline silicon layer 16, thus suppressing the diffusion of impurities into the gate silicon oxide layer 13.

In the semiconductor device of FIG. 1, however, as explained above, when an aspect ratio of the gate electrode (or the contact structure) has become larger, for example, when a contact structure having a radius of 0.4 μm and a height of 1 μm is formed by the polycrystalline silicon layers 14 and 16 in a 256 Mbit DRAM device, impurities are hardly doped into the contact structure. Therefore, a step of growing a polycrystalline silicon layer having a thickness of several hundreds of Å to 1000 Å and a step of doping impurities thereinto have to be repeated a plurality of times, thus increasing the manufacturing cost.

An embodiment of the present invention will be explained with reference to FIGS. 2A through 2D.

Figure 2A:
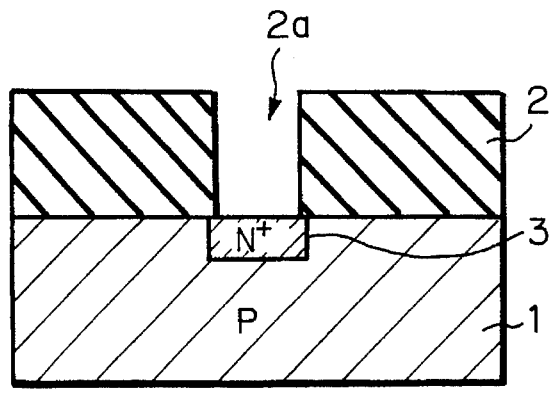
FIGS. 2A, 2B, 2C and 2D are cross-sectional views for explaining an embodiment of the method for manufacturing a semiconductor device according to the present invention.

Referring to FIG. 2A, a silicon oxide layer 2 is formed on a P-type monocrystalline silicon substrate 1, and therafter, a contact structure hole 2a is perforated in the silicon oxide layer 2 by using a photolithography process and a dry etching process. Next, impurities such as phosphorus or arsenic are implanted into the silicon substrate 1 with a mask of the silicon oxide layer 2, to form an $N^+$-type impurity diffusion region 3 within the silicon substrate 1.

Figure 2B:
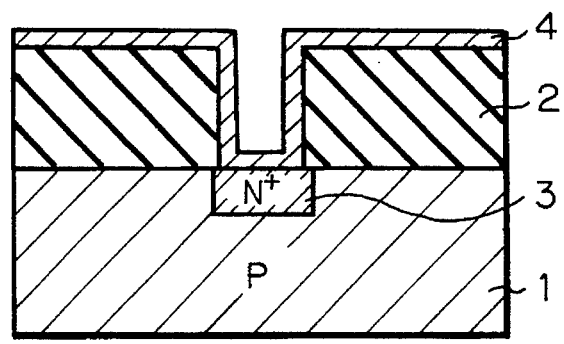

Next, referring to FIG. 2B, a polycrystalline (or amorphous) silicon layer 4 is grown simultaneously with the doping of phosphorus thereinto in a low pressure CVD (LPCVD) apparatus. In this case, the manufacturing conditions within the LPCVD apparatus are as follows:

$SiH_4$ gas stream amount: 1000 ccpm

1% $PH_3$ gas stream amount: 200 ccpm gas pressure: 0.2 to 1.0 Torr temperature: 550° to 600° C.

Figure 3:
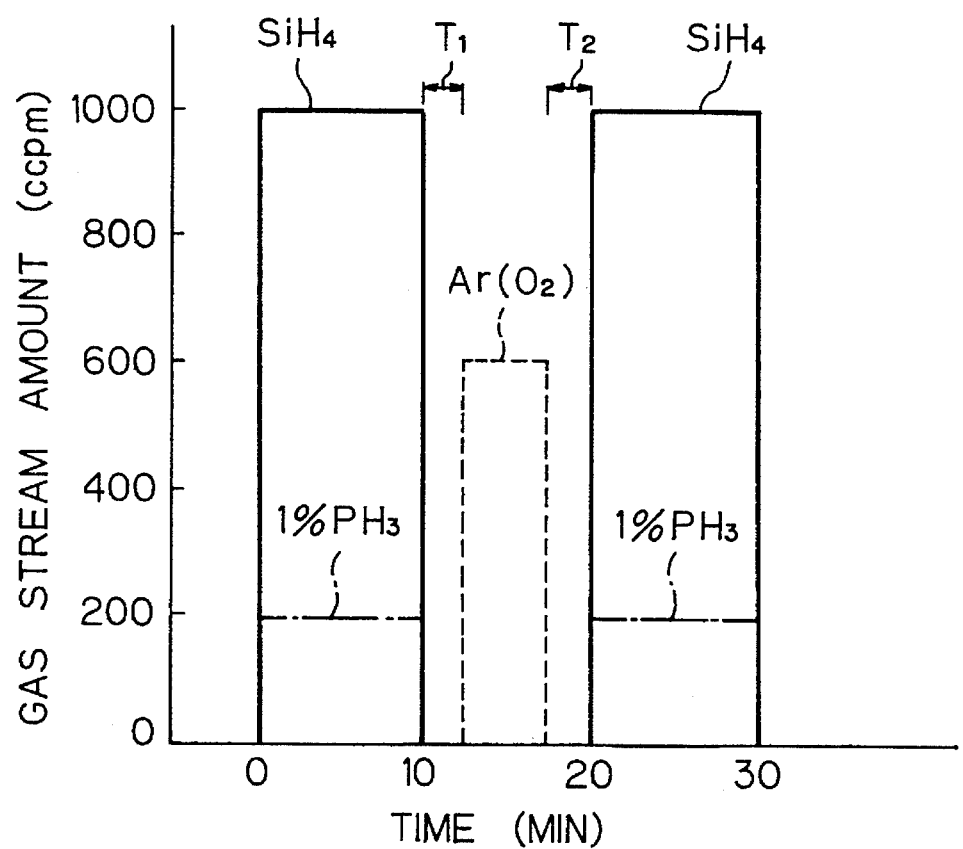
FIG. 3 is a timing diagram showing manufacturing conditions for the manufacturing method shown in FIGS. 2A, 2B, 2C and 2D.
Figure 4:
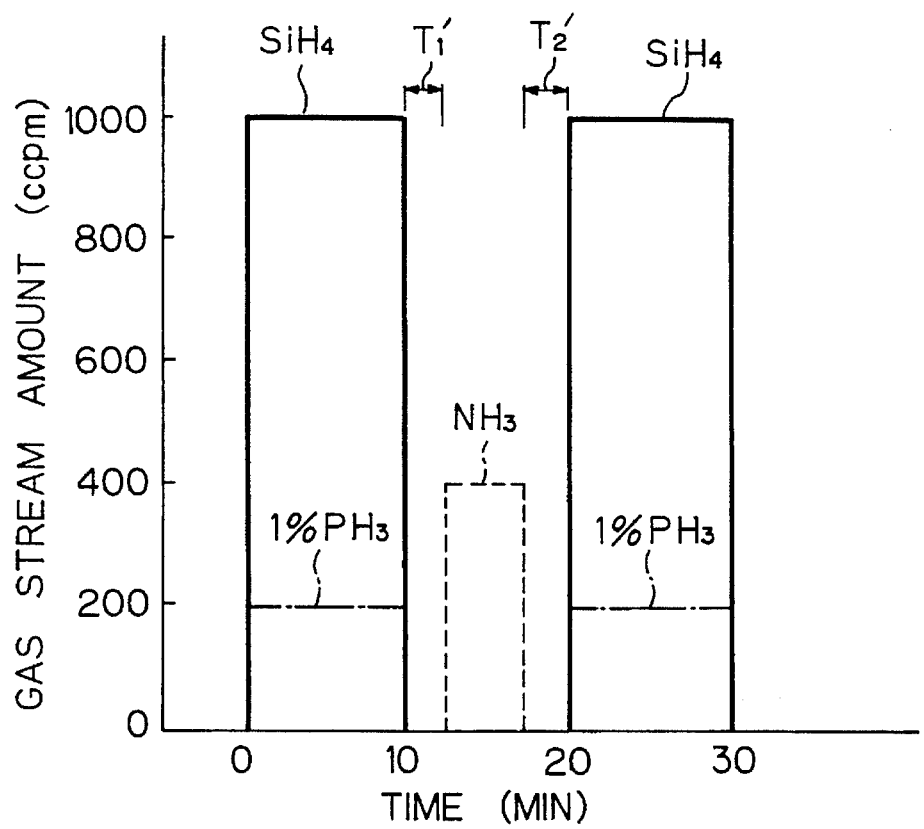
FIG. 4 is a timing diagram showing manufacturing conditions for the manufacturing method shown in FIGS. 2A, 2B, 2C and 2D.

This state continues for about ten minutes, as shown in FIGS. 3 and 4, to form the silicon layer 4 having a thickness of 500 to 1000 Å.

Figure 2C:
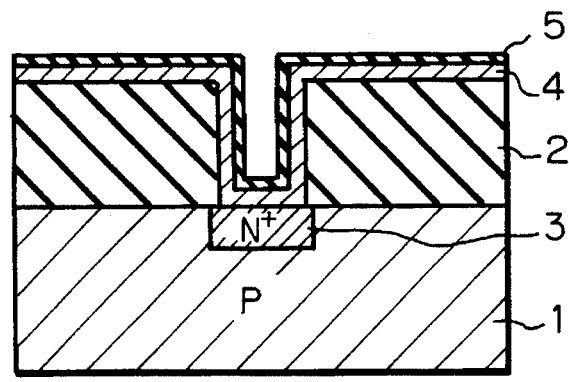

Next, referring to FIG. 2C, an impurity diffusion preventing layer 5 is grown.

For example, as shown in FIG. 3, a purging operation is carried out by using Ar gas or the like to purge the CVD apparatus and the surface of the wafer therein for a time period $T_1$. Then, Ar gas including a percent of oxygen is supplied in a stream of about 600 ccpm to the LPCVD apparatus, so that the semiconductor device is in an oxidative atmosphere for one minute to ten minutes. As a result, the silicon layer 4 is oxidized to form a silicon oxide layer having a thickness of several of Å to 20 Å as the impurity diffusion preventing layer 5.

In contrast with the above, as shown in FIG. 4, a purging operation is carried out by using Ar gas or the like to purge the CVD apparatus and the surface of the wafer therein layer 4 for a time period $T_1'$. Then, Ar gas including a percent of $NH_3$ gas is supplied in a stream of about 600 ccpm to the LPCVD apparatus, so that the semiconductor device is in a nitriding atmosphere for one minute to ten minutes. As a result, the silicon layer 4 is nitrided to form a silicon nitride layer having a thickness of several of Å to 20 Å as the impurity diffusion preventing layer 5.

After that, as shown in FIG. 3 or 4, the LPCVD apparatus is purged for a time period $T_2$ or $T_2'$.

Figure 2D:
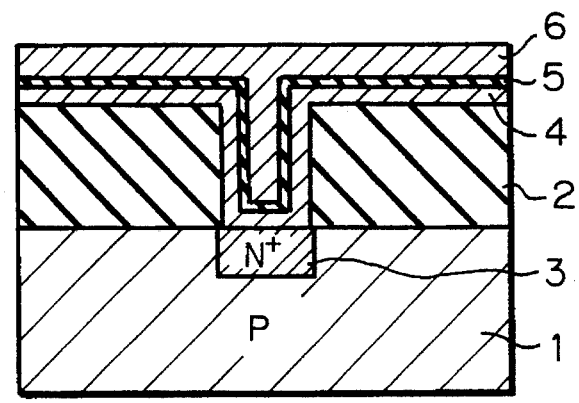

Next, referring to FIG. 2D, a polycrystalline (or amorphous) silicon layer 6 is grown simultaneously with doping phosphorus thereinto in the LPCVD apparatus. Also, in this case, the manufacturing conditions within the LPCVD apparatus are as follows:

$SiH_4$ gas stream amount: 1000 ccpm

1% $PH_3$ gas stream amount: 200 ccpm gas pressure: 0.2 to 1.0 Torr temperature: 550° to 600° C.

This state continues for about ten minutes, as shown in FIGS. 3 and 4, to form the silicon layer 6 having a thickness of 500 to 1000 Å.

Next, a heat operation at a temperature of 800° to 900° C. for five to ninety minutes is performed upon the semiconductor device to activate the impurities included in the silicon substrate 1 and the silicon layers 4 and 6.

Finally, the silicon layers 4 and 6 are patterned by using a photolithography process and a dry etching process to form an electrode or a contact structure.

Note that, the silicon nitride layer has an excellent impurity diffusion preventing effect as compared with the silicon oxide layer. Also, the silicon nitride layer has an impurity diffusion preventing effect for impurities such as iron other than phosphorus.

Figure 5:
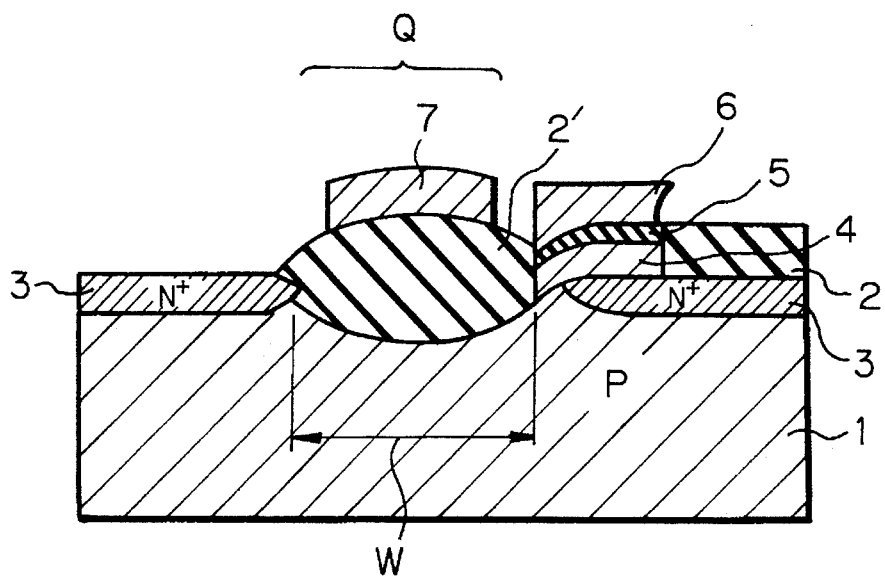
FIG. 5 is a cross-sectional view for explaining the effect of the present invention.
Figure 6:
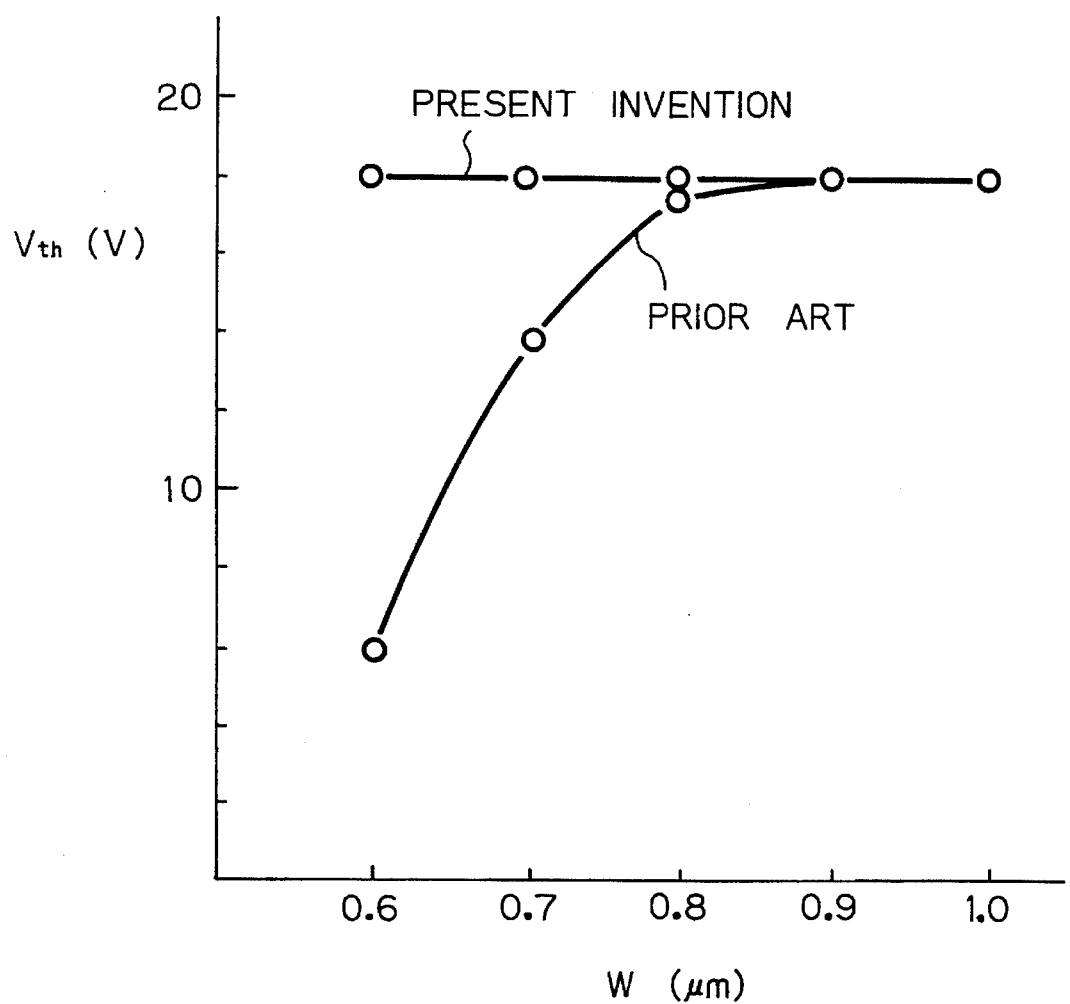
FIG. 6 is a graph showing the threshold voltage characteristics of the present invention.

Even after the heat operation upon the silicon layers 4 and 6 is completed, the diffusion of phosphorus from the silicon layers 4 and 6 into the impurity diffusion region 3 is remarkably suppressed due to the presence of the impurity diffusion preventing layer 5. For example, as illustrated in FIG. 5, a field silicon oxide layer 2' and an electrode 7 thereon are provided to form a parasitic MOS transistor Q. In this parasitic MOS transistor Q, a threshold voltage $V_{th}$ and a width W has a relationship as shown in FIG. 6. That is, according to the present invention, even when the width W is less than 0.8 μm, no reduction is observed in the threshold voltage $V_{th}$. This means that an isolation between elements is complete even when the distance W between the elements is less than 0.4 μm. Contrary to this, in the prior art where no impurity diffusion preventing layer is present, when the width W is less than 0.8 μm, a remarkable reduction is observed in the threshold voltage $V_{th}$. This means that an isolation between elements is incomplete when the distance W between the elements is less than 0.4 μm.

Also, when the above-mentioned embodiment is applied to a contact structure having a depth of about 1 μm, a relationship between a radius R and a resistance R' of the contact structure is shown in FIG. 7. The resistance R' in the embodiment is remarkably small as compared with the prior art where an impurity diffusion preventing layer is provided but impurities are doped into the second polycrystalline silicon after the complete formation thereof. That is, in the above-mentioned embodiment, since impurities are doped into silicon layers which are being grown, the resistance R' can be reduced.

Although phosphorus is used as the impurities in the above-mentioned embodiment, the present invention can be applied to other impurities such as arsenic and boron.

Also, in the LPCVD apparatus, although $SiH_4$ gas is used, $Si_2H_6$ gas, $Si_3H_8$ gas and the like can be used instead of $SiH_4$ gas. Further, the stream amount of $SiH_4$ gas and $PH_3$ gas can be values other than 1000 ccpm and 200 ccpm, respectively.

Further, Ar gas including $N_2O$ can be used instead of Ar gas including $O_2$ to create an oxidative atmosphere.

Still further, the silicon layers 4 and 6 can be made of a combination of polycrystalline silicon and amorphous silicon.

Also, the number of impurity diffusion preventing layers can be two or more, to arbitrarily change the resistance value of the entire silicon layers. Further, a silicon nitride layer and a silicon oxide layer can be simultaneously used.

As explained hereinbefore, according to the present invention, a high aspect-ratio silicon layer can be manufactured at a low manufacturing cost.

We claim:

1. A method for manufacturing a contact structure, comprising the steps of:
    forming an insulating layer on a semiconductor substrate;
    perforating a contact hole in said insulating layer;
    doping first impurities into said semiconductor substrate with a mask of said insulating layer to form an impurity diffusion region;
    growing a silicon layer in said contact hole while simultaneously doping second impurities into said silicon layer; and
    growing an impurity diffusion preventing layer by interrupting said silicon layer growing step at least one time.

2. A method as set forth in claim 1, wherein said impurity diffusion preventing layer growing step comprises a step of exposing said silicon layer in an oxidative atmosphere to oxidize a surface of said silicon layer.

3. A method as set forth in claim 1, wherein said impurity diffusion preventing layer growing step comprises the steps of:
    purging a CVD apparatus;
    exposing said silicon layer in an oxidative atmosphere of said CVD apparatus to oxidize a surface of said silicon layer; and
    purging said CVD apparatus.

4. A method as set forth in claim 1, wherein said impurity diffusion preventing layer growing step comprises a step of exposing said silicon layer in a nitriding atmosphere to nitride a surface of said silicon layer.

5. A method as set forth in claim 1, wherein said impurity diffusion preventing layer growing step comprises the steps of:
    purging a CVD apparatus;
    exposing said silicon layer in a nitriding atmosphere of said CVD apparatus to nitride a surface of said silicon layer; and
    purging said CVD apparatus.

6. A method as set forth in claim 1, wherein said silicon layer growing step and said impurity diffusion preventing step are carried out in the same CVD apparatus.

7. A method as set forth in claim 1, further comprising a step of heating said silicon layer to activate the impurities included in said silicon layer.

8. A method as set forth in claim 1, wherein said impurities are made of one of phosphorus, arsenic and boron.

9. A method as set forth in claim 1, wherein said silicon layer is made of at least one of polycrystalline silicon, amorphous silicon and a combination of polycrystalline silicon and amorphous silicon.

10. A method for manufacturing a contact structure, comprising the steps of:
    forming an insulating layer on a semiconductor substrate;
    perforating a contact hole in said insulating layer;
    doping first impurities into said semiconductor substrate with a mask of said insulating layer to form an impurity diffusion region;
    growing a first polycrystalline silicon layer while simultaneously doping second impurities into said first polycrystalline silicon layer;
    growing an impurity diffusion preventing layer on said first polycrystalline silicon layer; and
    growing a second polycrystalline silicon layer on said impurity diffusion preventing layer while simultaneously doping third impurities into said second polycrystalline silicon layer.

11. A method as set forth in claim 10, wherein said impurity diffusion preventing layer growing step comprises a step of exposing said first polycrystalline silicon layer in an oxidative atmosphere to oxidize a surface of said first polycrystalline silicon layer.

12. A method as set forth in claim 10, wherein said impurity diffusion preventing layer growing step comprises a step of exposing said silicon layer in a nitriding atmosphere to nitride a surface of said silicon layer.

13. A method for manufacturing a contact structure, comprising the steps of:
    forming an insulating layer on a semiconductor substrate;
    perforating a contact hole in said insulating layer;
    doping first impurities into said semiconductor substrate with a mask of said insulating layer to form an impurity diffusion region;
    growing a first amorphous silicon layer while simultaneously doping second impurities into said first amorphous silicon layer;
    growing an impurity diffusion preventing layer on said first amorphous silicon layer; and
    growing a second amorphous silicon layer on said impurity diffusion preventing layer while simultaneously doping third impurities into said second amorphous silicon layer.

14. A method as set forth in claim 13, wherein said impurity diffusion preventing layer growing step comprises a step of exposing said first amorphous silicon layer in an oxidative atmosphere to oxidize a surface of said first amorphous silicon layer.

15. A method as set forth in claim 13, wherein said impurity diffusion preventing layer growing step comprises a step of exposing said first amorphous silicon layer in a nitriding atmosphere to nitride a surface of said first amorphous silicon layer.

16. A method for manufacturing a contact structure, comprising the steps of:
    forming an insulating layer on a semiconductor substrate;
    perforating a contact hole in said insulating layer;
    doping first impurities into said semiconductor substrate with a mask of said insulating layer to form an impurity diffusion region;
    growing a first silicon layer made of polycrystalline silicon and amorphous silicon while simultaneously doping second impurities into said first silicon layer;
    growing an impurity diffusion preventing layer on said first silicon layer; and
    growing a second silicon layer made of polycrystalline silicon and amorphous silicon on said impurity diffusion preventing layer while simultaneously doping third impurities into said second silicon layer.

17. A method as set forth in claim 16, wherein said impurity diffusion preventing layer growing step comprises a step of exposing said first silicon layer in an oxidative atmosphere to oxidize a surface of said first silicon layer.

18. A method as set forth in claim 16, wherein said impurity diffusion preventing layer growing step comprises a step of exposing said first silicon layer in a nitriding atmosphere to nitride a surface of said first silicon layer.

19. A method as set forth in claim 1, wherein said doping of said second impurities into said silicon layer is performed at a substantially constant concentration level throughout said silicon layer growing step.

20. A method as set forth in claim 10, wherein said doping of said second impurities into said first polycrystalline silicon layer and said doping of said third impurities into said second polycrystalline silicon layer are both performed at a substantially constant and substantially identical concentration level throughout said first polycrystalline silicon layer growing step and said second polycrystalline silicon layer growing step, respectively.

21. A method as set forth in claim 13, wherein said doping of said second impurities into said first amorphous silicon layer and said doping of said third impurities into said second amorphous silicon layer are both performed at a substantially constant and substantially identical concentration level throughout said first amorphous silicon layer growing step and said second amorphous silicon layer growing step, respectively.

22. A method as set forth in claim 16, wherein said doping of said second impurities into said first silicon layer and said doping of said third impurities into said second silicon layer are both performed at a substantially constant and substantially identical concentration level throughout said first silicon layer growing step and said second silicon layer growing step, respectively.

23. A method as set forth in claim 1, wherein said contact structure has a radius of approximately 0.2 to 0.4 μm and a height of about 1 μm.

24. A method as set forth in claim 10, wherein said contact structure has a radius of approximately 0.2 to 0.4 μm and a height of about 1 μm.

25. A method as set forth in claim 13 wherein said contact structure has a radius of approximately 0.2 to 0.4 μm and a height of about 1 μm.

26. A method as set forth in claim 16, wherein said contact structure has a radius of approximately 0.2 to 0.4 μm and a height of about 1 μm.

* * * * *